(12) United States Patent
Xiong et al.

(10) Patent No.: US 8,435,816 B2
(45) Date of Patent: May 7, 2013

(54) METHOD FOR FABRICATING INGAALN LIGHT EMITTING DEVICE ON A COMBINED SUBSTRATE

(75) Inventors: Chuanbing Xiong, Jiangxi (CN); Fengyi Jiang, Jiangxi (CN); Li Wang, Jiangxi (CN); Shaohua Zhang, Jiangxi (CN); Guping Wang, Jiangxi (CN); Guangxu Wang, Jiangxi (CN)

(73) Assignee: Lattice Power (Jiangxi) Corporation, Nanchang (CN)

( * ) Notice: Subject to any disclaimer, the term of this patent is extended or adjusted under 35 U.S.C. 154(b) by 105 days.

(21) Appl. No.: 13/059,213

(22) PCT Filed: Aug. 22, 2008

(86) PCT No.: PCT/CN2008/001510
§ 371 (c)(1),
(2), (4) Date: Feb. 15, 2011

(87) PCT Pub. No.: WO2010/020077
PCT Pub. Date: Feb. 25, 2010

(65) Prior Publication Data
US 2011/0143467 A1 Jun. 16, 2011

(51) Int. Cl.
*H01L 21/00* (2006.01)
*H01L 21/44* (2006.01)
*H01L 21/36* (2006.01)
*H01L 21/20* (2006.01)

(52) U.S. Cl.
USPC ............ 438/34; 438/29; 438/46; 438/82; 438/99; 438/478; 257/E21.001; 257/E21.002; 257/E21.09; 257/E21.299; 257/E21.527

(58) Field of Classification Search ......... 257/E21.249, 257/E21.001, E21.002, E21.09, E21.299, 257/E21.527
See application file for complete search history.

(56) References Cited

U.S. PATENT DOCUMENTS

| | | |
|---|---|---|
| 2003/0170965 A1 | 9/2003 | Kondo |
| 2004/0245543 A1 | 12/2004 | Yoo |
| 2005/0014872 A1 | 1/2005 | Magdina |
| 2005/0082556 A1* | 4/2005 | Sung et al. ............... 257/96 |
| 2006/0157714 A1* | 7/2006 | Yoo et al. ................ 257/79 |
| 2007/0032041 A1* | 2/2007 | Lester et al. ............ 438/455 |
| 2008/0038857 A1 | 2/2008 | Kim |
| 2008/0093611 A1 | 4/2008 | Hahn |
| 2008/0251796 A1* | 10/2008 | Lee et al. ................ 257/88 |
| 2009/0026473 A1 | 1/2009 | Jiang |
| 2011/0049540 A1* | 3/2011 | Wang et al. ............. 257/94 |
| 2011/0140080 A1* | 6/2011 | Xiong et al. ............ 257/13 |

FOREIGN PATENT DOCUMENTS

WO 2007048346 A1 5/2007

* cited by examiner

*Primary Examiner* — Mohsen Ahmadi
(74) *Attorney, Agent, or Firm* — Shun Yao; Park, Vaughan, Fleming & Dowler LLP

(57) ABSTRACT

One embodiment of the present invention provides a method for fabricating an InGaAlN light-emitting semiconductor structure. During the fabrication process, at least one single-crystal sacrificial layer is deposited on the surface of a base substrate to form a combined substrate, wherein the single-crystal sacrificial layer is lattice-matched with InGaAlN, and wherein the single crystal layer forms a sacrificial layer. Next, the InGaAlN light-emitting semiconductor structure is fabricated on the combined substrate. The InGaAlN structure fabricated on the combined substrate is then transferred to a support substrate, thereby facilitating a vertical electrode configuration. Transferring the InGaAlN structure involves etching the single-crystal sacrificial layer with a chemical etchant. Furthermore, the InGaAlN and the base substrate are resistant to the chemical etchant. The base substrate can be reused after the InGaAlN structure is transferred.

18 Claims, 7 Drawing Sheets

4A

4D

4B

4E

4C

4F

METHOD FOR FABRICATING INGAALN LIGHT EMITTING DEVICE ON A COMBINED SUBSTRATE

BACKGROUND

1. Field of the Invention

The present invention relates to the fabrication of semiconductor light-emitting devices. More specifically, the present invention relates to a method for fabricating semiconductor multi-quantum-well (MQW) light-emitting device on a "single-crystal sacrificial layer/base substrate" type of combined substrate and transferring the light-emitting film to a support substrate.

2. Related Art

InGaAlN semiconductor light-emitting devices (LEDs) have been widely used in many applications, such as large screen-displays, traffic lights, backlight sources for display, illuminations, and so on. Traditionally, InGaAlN materials have been epitaxially grown on a sapphire substrate and are generally made into light-emitting devices with lateral-electrode configurations. Such devices often suffer from low efficiency and poor heat-sinking capability. In addition, the p-type conductive layer in such devices often absorbs light, thereby impairing the performance of light-emitting devices.

LEDs with a vertical electrode configuration often have better performance and improved reliability. To fabricate a vertical-electrode LED, it is possible to use laser-liftoff (LLO) and wafer-bonding techniques to transfer an InGaAlN film epitaxially grown on a sapphire substrate to a support substrate with a better thermal conductivity. However, the laser used in the LLO equipment is often expensive, and the LLO process is difficult to control. Consequently, it is difficult to achieve large-scale, cost-efficient production of vertical-electrode LEDs using the LLO technique.

Si substrates cost less and are easy to produce. It is economical to grow an InGaAlN epitaxial film on a Si substrate, and then use wet-etching and wafer-bonding techniques to transfer the InGaAlN epitaxial film to a support substrate and to fabricate a vertical-electrode LED. Such an approach can improve the light-emitting efficiency and lower the serial resistance of the LED. However, there remains a significant mismatch of thermal expansion constant between the Si substrate and InGaAlN film, which may lead to cracking of the InGaAlN structure during the epitaxial growth process. It has been shown that pre-patterning the Si substrate with grooves and mesas can reduce such stress and solve the cracking problem of InGaAlN film. However, the pre-patterning process and subsequent device fabrication is often complex. Furthermore, the large thermal-expansion-constant mismatch may lead to bending and deformation of the epitaxial film.

The bending and deformation of the epitaxial film can significantly impact the uniformity of the fabricated device and introduce difficulties into the fabrication process. For example, the growth temperature of the InGaN quantum well is lower than that of the n-type layer and the buffer layer; therefore, after the growth of the n-type layer and during the growth of the quantum well, the epitaxial film can be slightly bent. This bending directly affects the uniformity of the surface temperature field on the epitaxial film, thus affecting the uniformity of the quantum well, which in turn impairs the uniformity of key parameters such as emission wavelength and operation voltage. In addition, a severely bent and deformed epitaxial film will make subsequent wafer bonding difficult.

SUMMARY

One embodiment of the present invention provides a method for fabricating an InGaAlN light-emitting semiconductor structure. During the fabrication process, at least one single-crystal sacrificial layer is deposited on the surface of a base substrate to form a combined substrate, wherein the single-crystal sacrificial layer is lattice-matched with InGaAlN, and wherein the single crystal layer forms a sacrificial layer. Next, the InGaAlN light-emitting semiconductor structure is fabricated on the combined substrate. The InGaAlN structure fabricated on the combined substrate is then transferred to a support substrate, thereby facilitating a vertical electrode configuration. Transferring the InGaAlN structure involves etching the single-crystal sacrificial layer with a chemical etchant. Furthermore, the InGaAlN and the base substrate are resistant to the chemical etchant. The base substrate can be reused after the InGaAlN structure is transferred.

In a variation on this embodiment, the base substrate includes at least one of the following materials: sapphire, SiC, bulk GaN, bulk AlN, $MgAl_2O_4$, MgO, $LiGaO_2$, $\gamma$-$LiAlO_2$, $NdGaO_3$, $ScAlMgO_4$, $Ga_8La_2(PO_4)_6O_2$, $MoS_2$, $LaAlO_3$, $(Mn, Zn)Fe_2O_4$, Hf, Zr, ZrN, Sc, ScN, NbN, and TiN. The single-crystal sacrificial layer grown on the base substrate comprises at least one of the following materials: Si, GaAs, Ge, AlP, AlAs, GaP, GaSb, InP, InAs, InSb, ZnO, ZnS, ZnSe, ZnTe, CdS, CdSe, CdTe, HgSe, HgTePbS, PbSe, PbTe, $GaP_xAs_{1-x}$, $Ga_xAl_{1-x}As$, $MgAl_2O_4$, MgO, $LiGaO_2$, $\gamma$-$LiAlO_2$, $NdGaO_3$, $ScAlMgO_4$, $Ga_8La_2(PO_4)_6O_2$, $MoS_2$, $LaAlO_3$, $(Mn, Zn)Fe_2O_4$, Hf, Zr, ZrN, Sc, ScN, NbN, and TiN.

In a variation on this embodiment, the single-crystal sacrificial layer is at least 10 nm thick.

In a variation on this embodiment, the surface of the base substrate is pre-patterned with grooves and mesas.

In a variation on this embodiment, the single-crystal sacrificial layer is pre-patterned with grooves and mesas.

In a further variation on this embodiment, the grooves that separate the single-crystal mesas can penetrate either the entire or part of the single-crystal sacrificial layer.

In a variation on this embodiment, fabricating the InGaAlN semiconductor structure includes fabricating at least one of: an AlN intermediate layer, a GaN intermediate layer, an n-type doped GaN layer, a MQW light-emitting layer, and a p-type doped GaN layer.

In a variation on this embodiment, the support substrate can be a Si substrate or a metal substrate, and the metal substrate can be either a pure metal substrate or an alloy substrate. The metal substrate can be either a single layer or a multilayer metal substrate. If the metal substrate is not resistant to the chemical etchant, then the backside of the metal substrate needs to include at least 500 Å of metal that is resistant to the chemical etchant.

In a further variation, the metal substrate can be formed using one of the following techniques: electroplating, chemical plating, ion plating, thermal evaporation, magnetron sputtering, and electro-beam (e-beam) evaporation.

In a further variation, the different layers in the multilayer metal substrate are selectively corrosive.

In a further variation, the multilayer metal substrate can be divided using at least one of the following techniques: chemical etching; mechanical scribing; and mechanical dicing.

In a variation on this embodiment, an n-side electrode and a p-side electrode are fabricated on either side of the InGaAlN structure in a vertical-electrode configuration. The n-type electrode includes at least one of the following materials: Au/Ge/Ni alloy, Au/Si alloy, Au/Si/Ni alloy, TiN, and Ti/Al alloy.

In a variation on this embodiment, a metal layer is situated between the InGaAlN structure and the support substrate. The metal layer includes a p-side ohmic contact layer, an optional light reflective layer, and an optional diffusion barrier layer.

In a further variation on this embodiment, the p-side ohmic contact layer can be a continuous layer or comprise a periodical matrix of separated ohmic contact pads.

In a further variation, the p-side ohmic contact layer includes at least one of the following materials: Pt, Pd, Rh, an alloy which includes Rh, and Ni.

In a variation on this embodiment, the light-emitting surface of the LED is subject to a surface coarsening process.

In a further variation, the depth of the pattern of the surface coarsening treatment is less than two-thirds of the thickness of the n-type doped layer.

In a further variation, the surface coarsening process involves at least one of the following techniques: photoelectric chemical etching, chemical etching, inductively coupled plasma (ICP) etching, and reactive ion etching (RIE).

In a variation on this embodiment, the coarsened surface is covered by a passivation layer.

In a further variation, the passivation layer includes at least one of the following materials: $SiO_2$, SiN, $Al_2O_3$, and polyimide.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the claims.

Overview

Embodiments of the present invention provide a method for growing an InGaAlN semiconductor multi-quantum-well (MQW) light-emitting film on a "single-crystal sacrificial layer/base substrate" type of combined substrate and transferring the light-emitting film to a support substrate to fabricate a vertical-electrode LED. A single-crystal sacrificial layer is first formed on a base substrate, resulting in a combined substrate which includes the single-crystal sacrificial layer and a base substrate. An InGaAlN light-emitting film is then epitaxially grown on the combined substrate. Subsequently, the multilayer structure is flipped upside down to bond with a separate support substrate. A chemical etching process is applied to etch off the single-crystal sacrificial layer, consequently leading to the removal of the base substrate. An LED with a vertical electrode configuration is then fabricated using the transferred light-emitting film on the support substrate. The removed base substrate can be reused later for growing additional InGaAlN films. This fabrication process can significantly reduce the fabrication cost of the InGaAlN LEDs.

Epitaxial Growth on a Combined Substrate

Figure 1A:
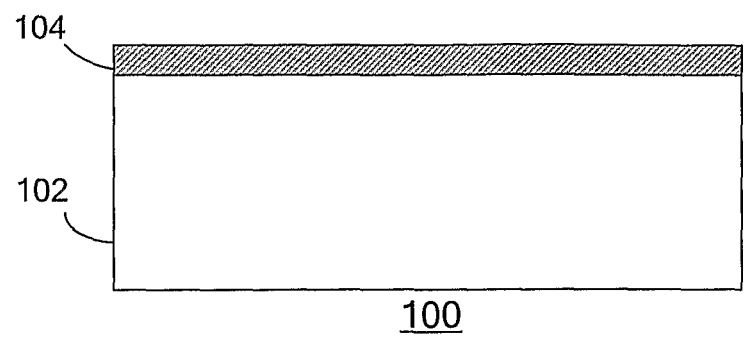
FIG. 1A illustrates the cross section of a combined substrate which includes a single-crystal sacrificial layer and a base substrate, in accordance with one embodiment of the present invention.

FIG. 1A illustrates the cross section of a combined substrate which includes a single-crystal sacrificial layer and a base substrate, in accordance with one embodiment of the present invention. A single-crystal sacrificial layer 104 is deposited on a base substrate 102. Both single-crystal sacrificial layer 104 and base substrate 102 form a combined substrate 100. In one embodiment, the thickness of single-crystal sacrificial layer 104 is between 10 nm and 100 μm. Techniques that can be used to deposit single-crystal sacrificial layer 104 onto the base substrate 102 include, but are not limited to: chemical-vapor-deposition (CVD), magnetron sputtering deposition, and electro-beam (e-beam) evaporation. Furthermore, single-crystal sacrificial layer 104 can be deposited in the same metal-organic-chemical-vapor-deposition (MOCVD) system used for the subsequent growth of the InGaAlN film.

Ideally, the thermal-expansion-constant mismatch between the base substrate and the InGaAlN film is small, and the single-crystal sacrificial layer is relatively thin. Therefore, the subsequently grown InGaAlN film is less likely to crack or bend. Choices of materials for base substrate 102 include, but are not limited to: sapphire, SiC, bulk GaN, bulk AlN, $MgAl_2O_4$, MgO, $LiGaO_2$, $\gamma$-$LiAlO_2$, $NdGaO_3$, $ScAlMgO_4$, $Ga_8La_2(PO_4)_6O_2$, $MoS_2$, $LaAlO_3$, $(Mn, Zn)Fe_2O_4$, Hf, Zr, ZrN, Sc, ScN, NbN, and TiN.

Choices of materials for single-crystal sacrificial layer 104 include, but are not limited to: Si, GaAs, Ge, AlP, AlAs, AlSb, GaP, GaSb, InP, InAs, InSb, ZnO, ZnS, ZnSe, ZnTe, CdS, CdSe, CdTe, HgSe, HgTePbS, PbSe, PbTe, $GaP_xAs_{1-x}$, $Ga_xAl_{1-x}As$, $MgAl_2O_4$, MgO, $LiGaO_2$, $\gamma$-$LiAlO_2$, $NdGaO_3$, $ScAlMgO_4$, $Ga_8La_2(PO_4)_6O_2$, $MoS_2$, $LaAlO_3$, $(Mn, Zn)Fe_2O_4$, Hf, Zr, ZrN, Sc, ScN, NbN, and TiN.

Note that it is possible to deposit one or more single-crystal sacrificial layers of different materials on the base substrate to form a combined substrate. Si/sapphire, Si/SiC, GaAs/sapphire, ZnO/sapphire, and ZnO/SiC are examples of a double-layer combined substrate containing one single-crystal sacrificial layer, and Si/ZnO/sapphire, Si/ZnO/SiC, and Si/GaAs/sapphire are examples of a triple-layer combined substrate containing two single-crystal sacrificial layers. In one embodiment of the present invention, a (111) Si single-crystal film is deposited on a (0001) sapphire substrate to form a combined substrate.

Figure 1B:
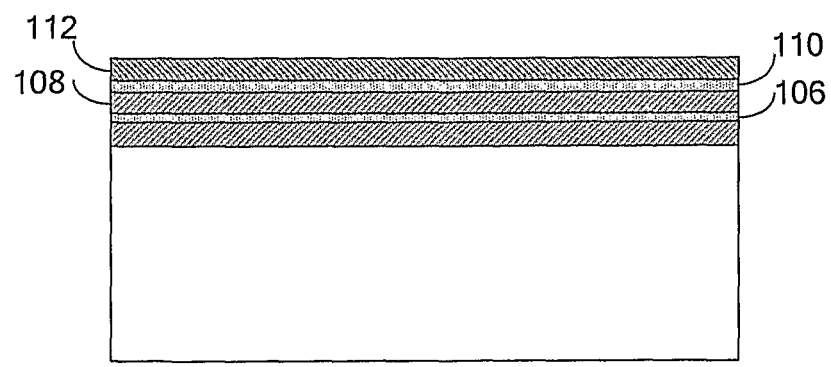
FIG. 1B illustrates the cross section of an MOCVD-grown InGaAlN film on the combined substrate, in accordance with one embodiment of the present invention.

After the preparation of the combined substrate, an InGaAlN ($In_xGa_yAl_{1-x-y}N$, $0<=x<=1$, $0<=y<=1$) semiconductor light-emitting film is grown on the combined substrate using, for example, an MOCVD growth technique. FIG. 1B illustrates an MOCVD-grown InGaAlN film on a combined substrate, wherein the InGaAlN film includes a buffer layer 106, an n-type doped GaN layer 108, a MQW light-emitting layer 110, and a p-type GaN layer 112.

In one embodiment, buffer layer 106 is formed by sequentially growing an Al seed layer, a first AlN intermediate layer, a first AlGaN transition layer, a first GaN intermediate layer, a second AlGaN transition layer, a second AlN intermediate layer, a third AlGaN transition layer, and a second GaN intermediate layer. N-type doped layer 108, which can be a GaN layer doped with Si, MQW layer 110, and p-type doped layer 112, which can be a GaN layer doped with Mg, are deposited on buffer layer 106. Optionally, an approximately 2 nm thick InGaN tunneling layer may be deposited (not shown in FIG. 1B) on the p-type doped layer. The purpose of depositing such a layer is to utilize the surface tension applied to the GaN layer by the InGaN layer. Such a tension force changes the polarization electric field on the surface of the p-type layer, which in turn increases the hole concentration on the surface, thus improving the ohmic contact characteristic. This optional InGaN layer can be optionally doped with Mg and can be seen as part of the p-doped layer. It is also optional to grow a layer of Si doped InGaN in the n-type doped layer to improve the reverse bias characteristic of the device.

Figure 2A:
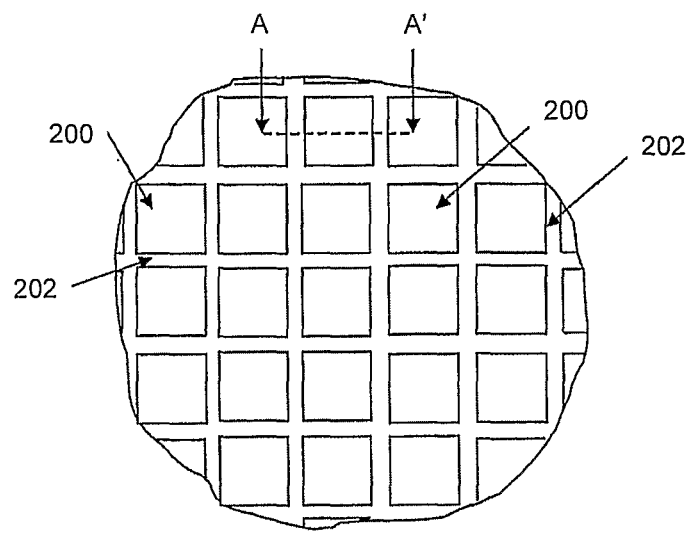
FIG. 2A illustrates part of a base substrate with pre-patterned grooves and mesas in accordance with one embodiment of the present invention.
Figure 2B:
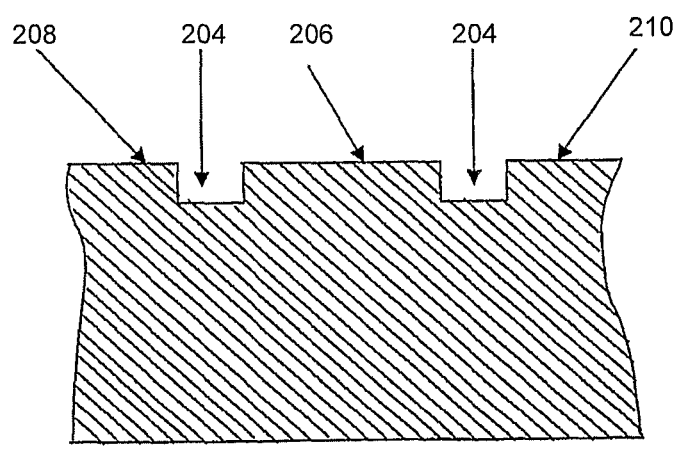
FIG. 2B illustrates the cross section of the pre-patterned base substrate in accordance with one embodiment of the present invention.

In addition to a continuous and intact base substrate, it is possible to use a base substrate with pre-patterned grooves and mesas. FIG. 2A illustrates a top view of part of a pre-patterned base substrate in accordance with one embodiment of the present invention. Grooves 202 can be formed using chemical etching, mechanical grinding, or laser cutting. Square sections 200 are separated by grooves 202. FIG. 2B more clearly illustrates the structure of mesas and grooves by showing a cross section of the pre-patterned base substrate along a horizontal line A-A' in FIG. 2A in accordance with one embodiment of the present invention. As seen in FIG. 2B, the sidewalls of grooves 204 effectively form the sidewalls of the isolated mesa structures, such as mesa 206, and partial mesas 208 and 210. Each mesa defines an independent surface area for growing subsequent light-emitting devices. In general, the size of each individually separated mesa is greater than 100×100 $\mu m^2$. In addition to forming square mesas 200 as shown in FIG. 2A, mesas with other geometries can be formed by changing the patterns of grooves 202. Some of these alternative geometries can include, but are not limited to: triangle, rectangle, parallelogram, hexagon, circle, or other non-regular shapes.

Figure 3A:
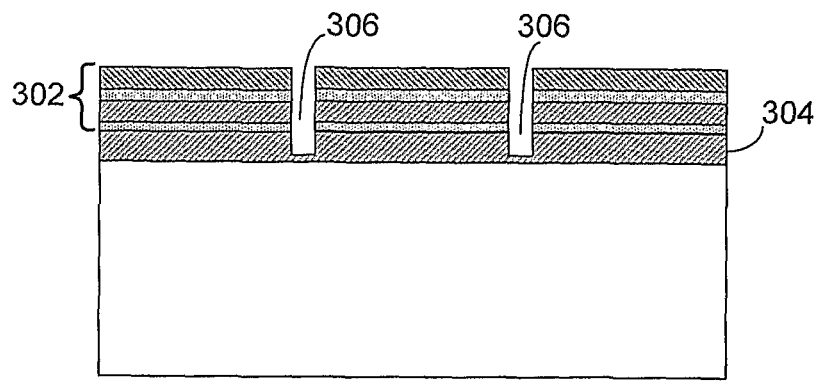
FIG. 3A illustrates the cross section of an MOCVD-grown InGaAlN film on the combined substrate with a pre-patterned single-crystal sacrificial layer in accordance with one embodiment of the present invention.
Figure 3B:
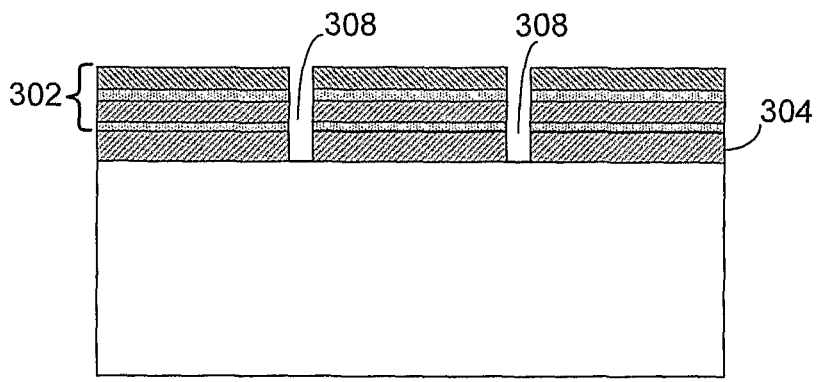
FIG. 3B illustrates the cross section of an MOCVD-grown InGaAlN film on the combined substrate with a pre-patterned single-crystal sacrificial layer in accordance with one embodiment of the present invention.

As mentioned before, the thickness of the single-crystal sacrificial layer can be between 10 nm and 100 μm. When the single-crystal sacrificial layer is substantially thick, it can also be pre-patterned with grooves and mesas. The grooves on the single-crystal sacrificial layer can either penetrate the entire or part of the layer. FIG. 3A illustrates the cross section of an epitaxial film 302 grown on a pre-patterned single-crystal sacrificial layer, in which grooves 306 penetrate only part of single-crystal sacrificial layer 304. FIG. 3B illustrates the cross section of an epitaxial film 302 grown on a pre-patterned single-crystal sacrificial layer 304, in which grooves 308 penetrate the entire single-crystal sacrificial layer 304.

Figure 3C:
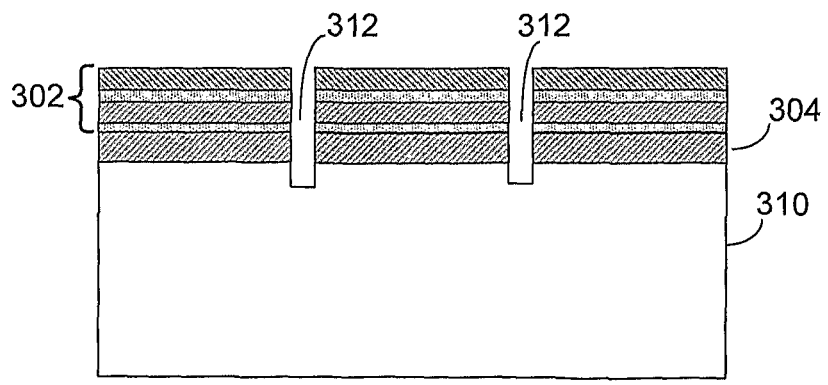
FIG. 3C illustrates the cross section of an MOCVD-grown InGaAlN film on the combined substrate with a pre-patterned single-crystal sacrificial layer and pre-patterned base substrate in accordance with one embodiment of the present invention.

FIG. 3C shows the cross section of an epitaxial film 302 grown on a pre-patterned combined substrate, in which grooves 312 separate the surface of base substrate 310 and single-crystal sacrificial layer 304 into segregated mesas. Pre-patterning the base substrate with grooves and mesas can improve the uniformity and flatness of the epitaxial film. The grooves can be formed using chemical etching, mechanical cutting, or laser cutting. In one embodiment, the width and the depth of grooves 312 are larger than 3 μm.

Figure 3D:
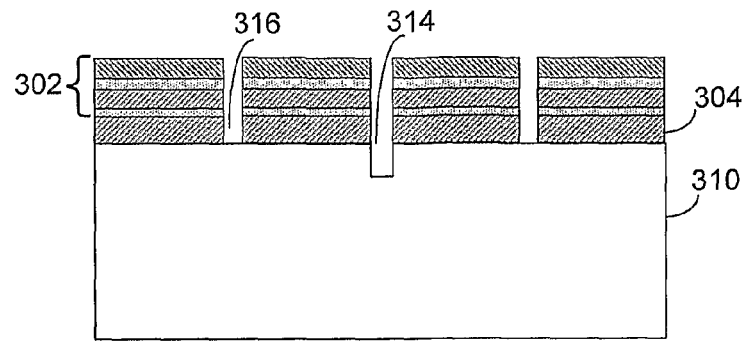
FIG. 3D illustrates the cross section of an MOCVD-grown InGaAlN film on the combined substrate with a pre-patterned single-crystal sacrificial layer and pre-patterned base substrate in accordance with one embodiment of the present invention.
Figure 3E:
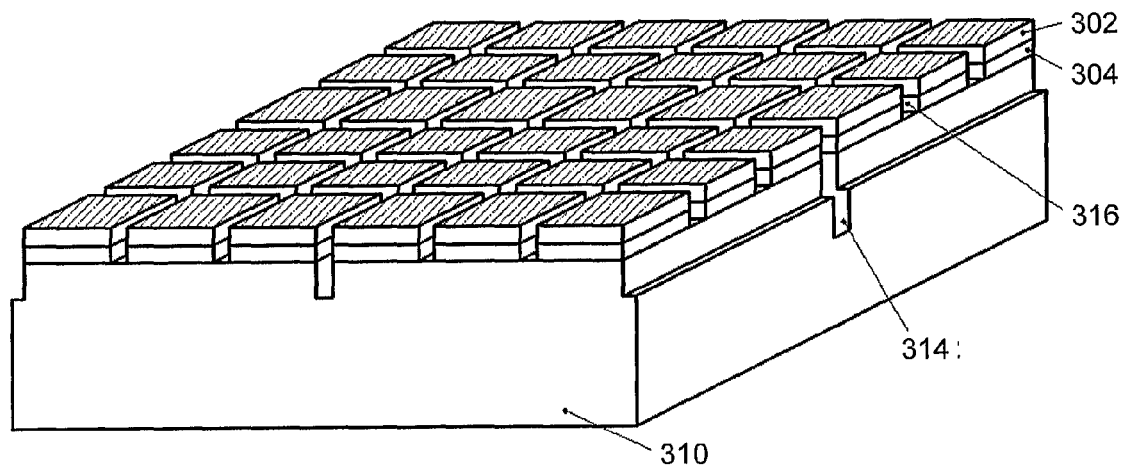
FIG. 3E illustrates a 3-D view of the structure illustrated in FIG. 3D in accordance with one embodiment of the present invention.

FIG. 3D shows one alternative for pre-patterning the combined substrate in accordance with one embodiment of the present invention. In FIG. 3D, base substrate 310 is pre-patterned with grooves 314, which divides base substrate 310 into segregated mesas with a relatively large surface area. In addition, single-crystal sacrificial layer 304 is also pre-patterned with grooves 316, which divides single-crystal sacrificial layer 304 into segregated mesas with a relatively small surface area. Grooves 316 penetrate the entire single-crystal sacrificial layer 304. Pre-patterning both the base substrate and the single-crystal sacrificial layer can further improve the uniformity and the flatness of the epitaxial layer. FIG. 3E illustrates a 3-D view of the structure illustrated in FIG. 3D.

Figure 3F:
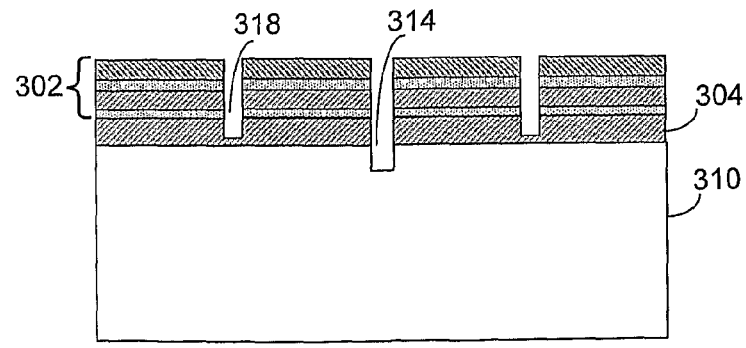
FIG. 3F illustrates the cross section of an MOCVD-grown InGaAlN film on the combined substrate with a pre-patterned single-crystal sacrificial layer and a pre-patterned base substrate in accordance with one embodiment of the present invention.

FIG. 3F shows another alternative for pre-patterning the combined substrate in accordance with one embodiment of the present invention. Similar to FIG. 3D, in FIG. 3F, both base substrate 310 and single-crystal sacrificial layer 304 are pre-patterned with grooves. However, grooves 318 only penetrate part of single-crystal sacrificial layer 304.

Fabrication of LED with Vertical Electrode Configuration

After the InGaAlN light-emitting film is fabricated on the combined substrate, it is optional to perform thermal annealing at approximately 760° C. to active the p-type dopant. Then a layer of platinum (Pt) can be evaporation-plated on the epitaxial film to form a p-type ohmic-contact layer. After the evaporation-plating of the Pt layer, an annealing treatment is performed. In one embodiment, the annealing is performed at around 550° C. for approximately 10 minutes under an atmosphere of $N_2:O_2=4:1$. Such an annealing condition can effectively activate the p-type impurity, which in one embodiment can be magnesium (Mg) ions. Note that Pt can also absorb hydrogen atoms which passivate Mg. The thickness of the Pt p-side ohmic-contact layer is between 10 Å and 10000 Å. In one embodiment of the present invention, the thickness of the Pt layer is approximately 500 Å. In addition to pure Pt, choices of materials for the p-side ohmic-contact layer include, but are not limited to: Pt/Au alloy, Pt/Rh alloy, NiO/Au alloy, indium tin oxide (ITO), alternating layers of Pt and Au, alternating layers of Pt and Rh, alternating layers of Pt, Rh, and gold, and Pt/Rh/Au alloy.

In order to increase the light extraction efficiency of the vertical-electrode LED, it is possible to include a transparent layer and an adjacent reflective metal layer in the p-side ohmic-contact layer. The transparent layer can be the aforementioned metal ohmic-contact layer with a thickness of less than 200 Å, or conductive oxides such as NiO/Au, ITO, and the combination of NiO/Au and ITO. The thickness of a conductive oxide layer can be either larger or smaller than 200 Å. The reflective metal layer can be formed by depositing a thin layer of Ag or Al. It is also possible to use a highly reflective alloy to form the reflective layer. Optionally, a diffusion barrier layer may be included between the ohmic-contact layer and the reflective layer. In one embodiment, the diffusion barrier layer is highly transparent to light. In addition, the diffusion barrier layer includes materials with stable physical and chemical properties, thus is able to effectively prevent any destructive effect on the ohmic-contact layer caused by the reflective metal layer. In order to decrease the amount of light absorbed by the ohmic-contact layer, it is possible to form an ohmic-contact layer using a discontinuous matrix of ohmic-contact pads. In such a situation, the ohmic-contact layer only covers a small portion of the p-type doped layer, whereas other portions of the p-type doped GaN layer are in direct contact with the reflective metal layer or the diffusion barrier layer. It is also possible to make the diffusion barrier layer discontinuous. Note that the p-side contact layer in embodiments of the present invention includes the ohmic-contact layer, the optional diffusion barrier layer, and the optional reflective layer.

Figure 4:
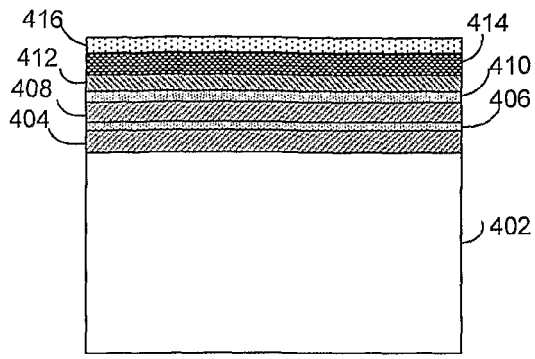
FIG. 4 presents a diagram illustrating the process of fabricating a vertical-electrode light-emitting device in accordance with one embodiment of the present invention.
Figure 4:
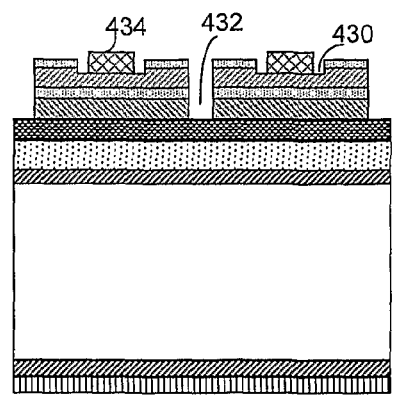
Figure 4:
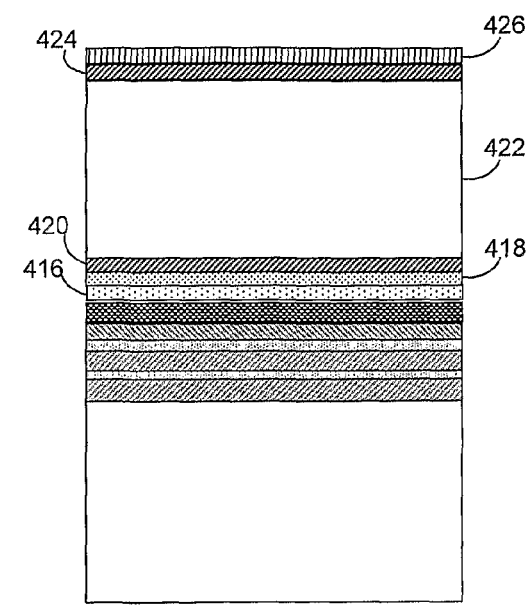
Figure 4:
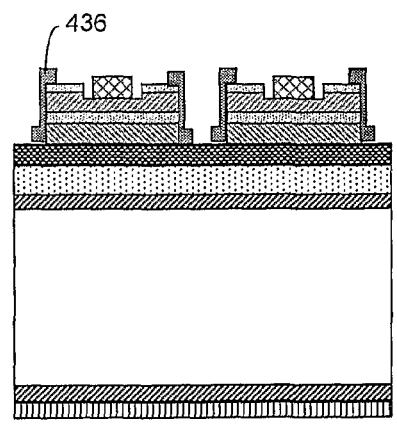
Figure 4:
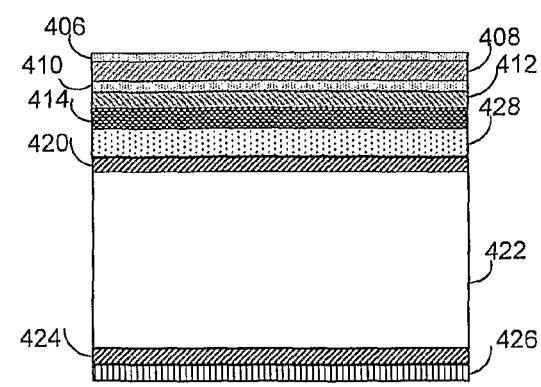
Figure 4:
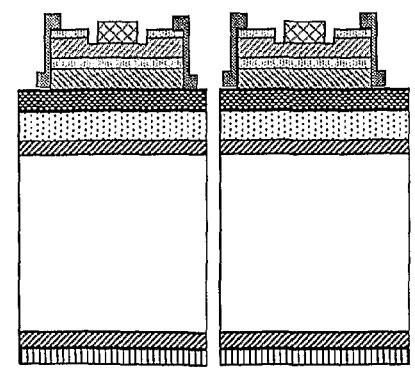

FIG. 4 presents a diagram illustrating the process of fabricating individual vertical-electrode light-emitting devices in accordance with one embodiment of the present invention. In operation 4A, after growing a single-crystal sacrificial layer 404, a buffer layer 406, an n-type doped GaN layer 408, an MQW layer 410, and a p-type doped GaN layer 412 on a base substrate 402, a p-type ohmic-contact layer 414, and a pressure-welding metal layer 416 are deposited. Pressure-welding metal layer 416 is resistant to a chemical etchant that is later used to etch off single-crystal sacrificial layer 404. Choices of materials to form pressure-welding metal layer 416 include, but are not limited to: Au, Au alloys such as Au/In, Au/Sn, Au/Ga, Au/Sb, or ternary, quaternary, and other higher order alloys of Au, Pt, Pd, Rh, or an alloy that includes at least one of: Au, Pt, Pd, and Rh.

In operation 4B, a support substrate 422 and the epitaxial film are pressure-welded together. Ohmic-contact layers 420 and 424 are deposited on separate sides of support substrate 422. A pressure-welding metal layer 418 and a backside protective layer 426 are deposited on ohmic-contact layers 420 and 424, respectively. Support substrate 422 can be a Si substrate or a metal substrate. One embodiment of the present invention uses a double side polished single-crystal (100) Si substrate with a resistance of less than 0.002 Ω·cm as support substrate 422. If a metal substrate is used as support substrate 422 and the metal substrate is resistant to the chemical etchant, then ohmic-contact layers 420 and 424, and backside protective layer 426 can be optional. Otherwise, only ohmic-contact layers 420 and 424 can be optional, while backside protective layer 426 is still needed to protect the support metal substrate from the chemical etchant. The metal substrate can include one or more metal layers, and each layer may include pure metal or an alloy. In one embodiment, the layers are selectively corrosive to enable selective chemical etching, which can be later used to divide the multilayer structure to form individual LED devices. Pressure-welding metal layer 418 and backside protective layer 426 on the support substrate can include similar material which forms pressure-welding metal layer 416 on the epitaxial film. For 2-inch epitaxial film and substrate, in one embodiment of the present invention, the pressure-welding is performed using 800 Kg force at 320° C. for 1000 seconds. The pressure-welding is performed in a vacuum chamber with a chamber pressure less than 30 Torr. After welding, the pressure is released after the temperature is lowered to the room temperature. Note that it is possible to perform the pressure-welding using other amounts of force and under other temperatures. The pressure-welding can also be performed in a chamber with a chamber pressure equal to or larger than one standard atmosphere pressure. The chamber atmosphere can be $O_2$, $N_2$, a combination of $O_2$ and $N_2$, or inert gases. It is possible to perform the pressure-welding under other conditions as long as pressure-welding layers 416 and 418 can be welded together without significant modification to the contact characteristic of p-type ohmic contact and the property of the InGaAlN film.

In operation 4C, single-crystal sacrificial layer 404 is etched off using a wet etching technique. Consequently, the epitaxial film is separated from base substrate 402 and is transferred to the support substrate. Base substrate 402 can be reused later for epitaxial film growth. Depending on the choice of materials for the support substrate, the remaining multilayer structure after the removal of the base substrate may include backside protective layer 426, ohmic-contact layer 424, support substrate 422, ohmic-contact layer 420, a fused metal layer 428 which is the result of the pressure-welding of layers 416 and 418, p-side contact layer 414, p-type doped GaN layer 412, MQW layer 410, n-type doped GaN layer 408, and buffer layer 406. If Si is used as the single-crystal sacrificial layer, the chemical etchant can be a known Si etchant. In one embodiment of the present invention, the Si single-crystal sacrificial layer is etched at 80° C. using a mixture of HF, and $CH_3COOH$ with a ratio of 5:2:2.

In operation 4D, electrode grooves 430, upon which the n-type electrodes 434 are deposited, and separation grooves 432, which are later used to separate individual LED devices, are formed. The depth of electrode grooves 430 is greater than the thickness of the buffer layer in order to expose the n-type doped layer. Several etching techniques including reactive-ion-etching (RIE) and wet etching can be used to form the electrode groove. The gas used in the RIE chamber may include chlorine or other commonly used gases for etching GaN. The etchant used for the wet etching may include $H_3PO_4$, NaOH, and KOH. It is optional to perform the etching under ultraviolet radiation. Choices of materials for forming n-type electrode 434 include, but are not limited to: an Au/Ge/Ni alloy, an Au/Si alloy, TiN, and an alloy that includes Ti or Al. In one embodiment of the present invention, n-type electrode 434 is formed using an Au/Ge/Ni alloy which includes 86.24% Au, 11.76% Ge, and 2% Ni. Regardless of the type of metal in n-type electrode 434 that is in contact with the n-type ohmic-contact, the top metal layer of n-type electrode 434 is either a Ti/Au alloy or a Ni/Au alloy, which can be conveniently used later for the pressure-welding of the electrode lead wire. Depending on the property of the support substrate, the part of fused metal layer 428 and p-type contact layer 414 underneath separation grooves 432 can either be removed or preserved. If the support substrate can be mechanically cleaved, then it is preferable to remove the fused metal layer and p-type contact layer underneath the separation grooves, thus prolonging the lifetime of the cleaver. If the support substrate is a metal substrate and a laser cutting technique is utilized, then the fused metal layer and the p-type contact layer may be preserved. However, if chemical etching is to be performed, the fused metal layer and the p-type contact layer underneath the separation grooves need to be removed beforehand.

In operation 4E, passivation layer 436 is deposited on the top of the device, substantially covering the sidewalls of buffer layer 406, n-type doped GaN layer 408, MQW layer 410, p-type doped GaN layer 412, and part of the horizontal surface of buffer layer 406 which is not covered by n-type electrode 434. Choices of materials for passivation layer 436 include, but are not limited to: $SiO_2$, $Al_2O_3$, polyimide, SiN, and other commonly used passivation materials for electrical devices. In one embodiment of the present invention, SiN is used for passivation layer 436.

In operation 4F, the multilayer structure is divided to form individual LED devices. Note that it is optional to have the light-emitting surface undergo a surface coarsening treatment. The patterns of the surface coarsening treatment include, but are not limited to: hexagonal-pyramid, cylinder, cone, ring, and other irregular shapes. The surface coarsening patterns can be formed using at least one of the following processes: photoelectric chemical etching, chemical etching, ICP etching, and RIE etching. In one embodiment, after etching, the depth of the surface coarsening pattern is less than two-thirds of the n-type doped layer.

Figure 5:
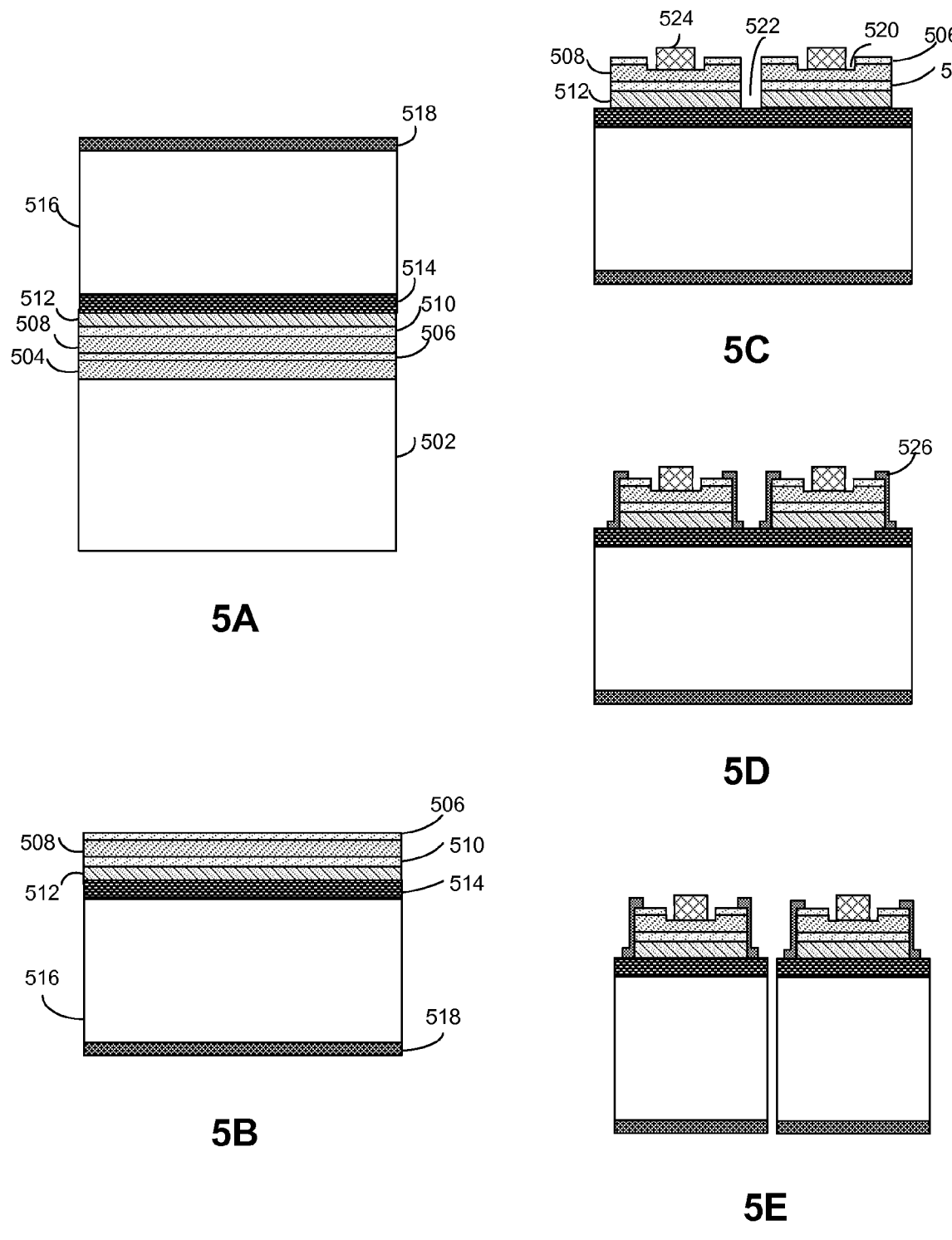
FIG. 5 presents a diagram illustrating the process of fabricating a vertical-electrode light-emitting device in accordance with one embodiment of the present invention.

FIG. 5 presents a diagram illustrating the process of fabricating individual vertical-electrode light-emitting devices in accordance with one embodiment of the present invention. In operation 5A, after growing a single-crystal sacrificial layer 504, a buffer layer 506, an n-type doped GaN layer 508, an MQW layer 510, a p-type doped GaN layer 512 on a base substrate 502, a p-side ohmic contact layer 514, a metal substrate 516, and a metal protective layer 518 are deposited. The deposition processes and the material choices for base substrate 502, single-crystal sacrificial layer 504, buffer layer 506, n-type doped GaN layer 508, MQW layer 510, p-type doped GaN layer 512, and p-side ohmic-contact layer 514 are similar to the ones used in operation 4A. Metal substrate 516 is deposited on the epitaxial structure after the formation of p-side ohmic-contact layer 514 using at least one of the following deposition techniques: electroplating, chemical plating, ion plating, thermal evaporation, magnetron sputtering deposition, electro-beam (e-beam) evaporation, and thermal spray coating. Metal substrate 516 can include pure metal, or an alloy, and metal substrate 516 can include a single layer or multiple layers of metal. If metal substrate 516 can resist the chemical etchant which is later used to etch off single-crystal sacrificial layer 504, then metal protective layer 518 is optional.

In operation 5B, single-crystal sacrificial layer 504 is etched off using a wet etching technique resulting in the removal of base substrate 502. The wet etching technique can be similar to the one used in operation 4C.

In operation 5C, electrode grooves 520, upon which the n-type electrodes 524 are deposited, and separation grooves 522 which are later used to separate individual LED devices, are formed. The formation processes of electrode grooves 520 and separation grooves 522 are similar to the ones used in operation 4D. The formation process and the choice of materials for n-type electrodes 524 are similar to the ones used in operation 4D.

In operation 5D, passivation layers 526 are deposited on top of the device substantially covering the sidewalls of buffer layer 506, n-type doped GaN layer 508, MQW layer 510, p-type doped GaN layer 512, and part of the horizontal surface of buffer layer 506 which is not covered by n-side electrode 524. The formation process and the choice of materials for passivation layer 526 are similar to the one used in operation 4E.

In operation 5E, the multilayer structure is divided to form individual LED devices. Techniques which can be used to separate the metal substrate include but are not limited to the following: laser scribing, mechanical scribing, plasma cutting, electric-arc cutting, chemical etching, and mechanical cleaving.

Figure 6:
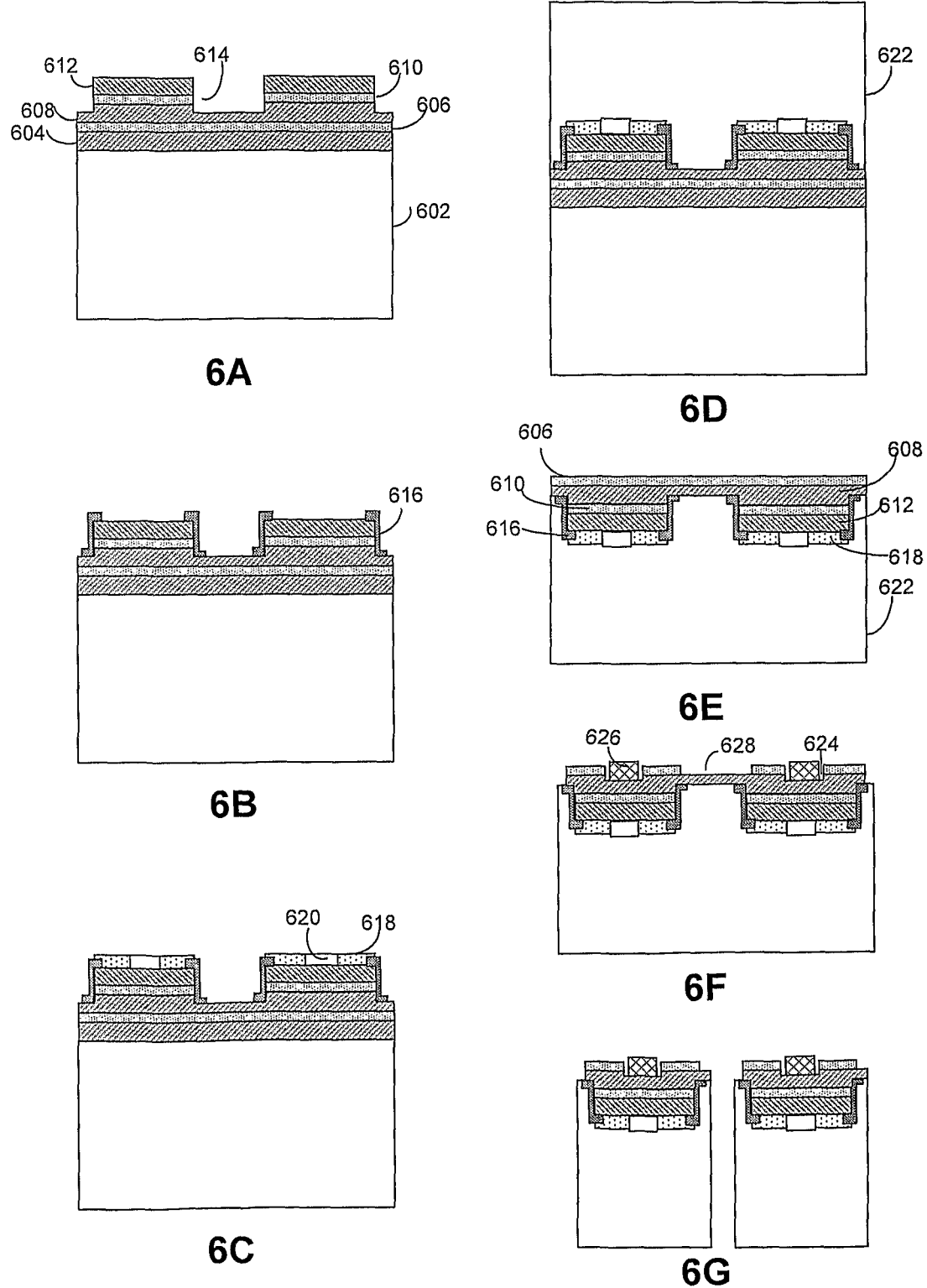
FIG. 6 presents a diagram illustrating the process of fabricating a vertical-electrode light-emitting device in accordance with one embodiment of the present invention.

FIG. 6 presents a diagram illustrating the process of fabricating individual vertical-electrode light-emitting devices in accordance with one embodiment of the present invention. In operation 6A, after growing a single-crystal sacrificial layer 604, a buffer layer 606, an n-type doped GaN layer 608, an MQW layer 610, and a p-type doped GaN layer 612 on a base substrate 602, the epitaxial film is partially etched to form vertical steps 614. Vertical steps 614 penetrate the entire p-type doped GaN layer 612 and MQW layer 610, as well as part of n-type doped GaN layer 608. The formation processes and the choices of materials for base substrate 602, single-crystal sacrificial layer 604, buffer layer 606, n-type doped GaN layer 608, MQW layer 610, and p-type doped GaN layer 612 are similar to the ones used in operations 4A and 5A.

In operation 6B, passivation layers 616 are deposited on top of the device substantially covering the sidewalls of vertical steps 614. The formation process and the choice of materials for passivation layer 616 are similar to the ones used in operations 4E and 5D.

In operation 6C, a p-type ohmic-contact layer 618 is formed on top of p-type doped GaN layer 612. In order to avoid current crowdedness, a complementary electrode region 620 is placed inside p-type ohmic-contact layer 618. Ohmic-contact material is removed from complementary electrode region 620 which can be either left as an opening or filled with insulating material. Complementary electrode region 620 can also be formed by reducing the density of the holes in the region.

In operation 6D, a metal substrate 622 is deposited on the multilayer structure. The forming process and the choice of materials for metal substrate 622 are similar to the ones used in operation 5A.

In operation 6E, single-crystal sacrificial layer 604 is etched off using a wet etching technique resulting in the removal of base substrate 602. The wet etching technique can be similar to the ones used in operations 4C and 5B. FIG. 6E illustrates the cross section of the resulting multilayer structure including, from the top down, buffer layer 606, n-type doped GaN layer 608, MQW layer 610, p-type doped GaN layer 612, passivation layer 616, p-type ohmic contact layer 618, and metal substrate 622.

In operation 6F, electrode grooves 624, upon which the n-type electrodes 626 are deposited, and separation grooves 628, which are later used to separate individual LED devices, are formed. The formation processes of electrode grooves 624 and separation grooves 628 are similar to the ones used in operations 4D and 5C. The formation process and the choice of materials for n-type electrodes 626 are similar to the ones used in operations 4D and 5C.

In operation 6G, the multilayer structure is divided to form individual LED devices. Techniques which can be used to separate the metal substrate are similar to the ones used in operation 4F and 5E.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for fabricating an InGaAlN light-emitting semiconductor structure, comprising:
   depositing a first single-crystal sacrificial layer on the surface of a base substrate to form a combined substrate, wherein the first single-crystal sacrificial layer is lattice-matched with InGaAlN, and wherein the first single-crystal sacrificial layer comprises at least one of: GaAs, Ge, AlP, AlAs, GaP, GaSb, InP, InAs, InSb, ZnSe, ZnTe, CdS, CdSe, CdTe, HgSe, HgTePbS, PbSe, PbTe, $GaP_xAs_{1-x}$, $Ga_xAl_{1-x}As$, $MgAl_2O_4$, $LiGaO_2$, $\gamma$-$LiAlO_2$, $NdGaO_3$, $ScAlMgO_4$, $Ga_8La_2(PO_4)_6O_2$, $MoS_2$, $LaAlO_3$, $(Mn, Zn)Fe_2O_4$, Hf, Zr, ZrN, Sc, ScN, NbN, and TiN; then
   depositing a second single-crystal sacrificial layer on the first single-crystal sacrificial layer, wherein the base substrate and the first and second single-crystal sacrificial layers form a triple-layer combined substrate; then
   epitaxially fabricating the InGaAlN light-emitting semiconductor structure on the combined substrate;
   transferring the InGaAlN structure fabricated on the combined substrate to a support substrate, thereby facilitating a vertical electrode configuration;
   covering a light-emitting surface of the InGaAlN structure with a passivation layer; and then
   fabricating metal layers which are situated between the InGaAlN structure and the support substrate, wherein the metal layers comprise a p-side ohmic-contact layer, a light reflective layer, and a diffusion barrier layer; and
   wherein the p-side ohmic-contact layer comprises a periodical matrix of segregated ohmic-contact pads;
   wherein transferring the InGaAlN structure comprises etching the first single-crystal sacrificial layer with a chemical etchant;
   wherein the InGaAlN and the base substrate are resistant to the chemical etchant; and
   wherein the base substrate can be reused after the InGaAlN structure is transferred.

2. The method of claim 1,
   wherein the base substrate comprises at least one of the following materials: sapphire, SiC, bulk GaN, bulk AlN, $MgAl_2O_3$, MgO, $LiGaO_2$, $\gamma$-$LiAlO_2$, $NdGaO_3$, $ScAlMgO_4$, $Ga_8La_2(PO_4)_6O_2$, $MoS_2$, $LaAlO_3$, $(Mn, Zn)Fe_2O_4$, Hf, Zr, ZrN, Sc, ScN, NbN, and TiN; and
   wherein the first and the second single-crystal sacrificial layers further comprise at least one of the following materials: ZnO, ZnS, and MgO.

3. The method of claim 1,
   wherein the thickness of the first single-crystal sacrificial layer is between 10 nm and 100 μm.

4. The method of claim 1, further comprising pre-patterning the base substrate with grooves and mesas.

5. The method of claim 1,
   wherein the first single-crystal sacrificial layer is pre-patterned with grooves and mesas.

6. The method of claim 5,
   wherein the grooves that separate the mesas penetrate either the entire or part of the first single-crystal sacrificial layer.

7. The method of claim 1,
   wherein fabricating the InGaAlN semiconductor structure comprises fabricating at least one of:
   an AlN buffer layer,
   a GaN buffer layer,
   an n-type doped GaN layer,
   an MQW light-emitting layer,
   a p-type doped GaN layer.

8. The method of claim 1,
   wherein the support substrate can be either a Si substrate or a metal substrate;
   wherein the metal substrate can be either a pure metal substrate or an alloy substrate;
   wherein the metal substrate can be either a single-layer metal substrate or a multilayer metal substrate; and
   wherein if the metal substrate is not resistant to the chemical etchant, the backside of the metal substrate includes at least 500 Å of metal that is resistant to the chemical etchant.

9. The method of claim 8,
   further comprising forming the metal substrate using at least one of the following techniques:
   electroplating,
   chemical plating,
   ion plating,
   thermal evaporation,
   magnetron sputtering deposition, and
   electro-beam (e-beam) evaporation.

10. The method of claim 8,
    wherein the different layers in the multilayer metal substrate are selectively corrosive.

11. The method of claim 8,
    wherein the metal substrate can be divided using at least one of the following techniques:
    chemical etching;
    mechanical scribing; and
    mechanical dicing.

12. The method of claim 1,
    further comprising fabricating an n-side electrode and a p-side electrode on either side of the InGaAlN structure in a vertical-electrode configuration;
    wherein the n-side electrode comprises at least one of the following materials:
    Au/Ge/Ni alloy;
    Au/Si alloy;
    Au/Si/Ni alloy;
    TiN; and
    Ti/Al alloy.

13. The method of claim 1,
    wherein the p-side ohmic-contact layer comprises at least one of the following materials:
    Pt;
    Pd;
    Rh; and
    Ni.

14. The method of claim 1,
    further comprising subjecting the light-emitting surface of the InGaAlN structure to a surface-coarsening process.

15. The method of claim 14,
    wherein the depth of the patterns resulting from the surface-coarsening process is less than two-thirds of the thickness of an n-type doped layer of the InGaAlN structure.

16. The method of claim 14,
    wherein the surface-coarsening process involves at least one of the following techniques:
    photoelectric chemical etching;
    chemical etching;
    inductively coupled plasma (ICP) etching; and
    reactive ion etching (RIE).

17. The method of claim 1,
wherein the passivation layer comprises at least one of the following materials:
SiO$_2$;
SiN;
Al$_2$O$_3$; and
polyimide.

18. An InGaAlN light-emitting device fabricated by a process, wherein the process comprises:
depositing a first single-crystal sacrificial layer on the surface of a base substrate to form a combined substrate, wherein the first single-crystal sacrificial layer is lattice-matched with InGaAlN, and wherein the first single-crystal sacrificial layer comprises at least one of: GaAs, Ge, AlP, AlAs, GaP, GaSb, InP, InAs, InSb, ZnSe, ZnTe, CdS, CdSe, CdTe, HgSe, HgTePbS, PbSe, PbTe, GaP$_x$As$_{1-x}$, Ga$_x$Al$_{1-x}$As, MgAl$_2$O$_4$, LiGaO$_2$, γ-LiAlO$_2$, NdGaO$_3$, ScAlMgO$_4$, Ga$_8$La$_2$(PO$_4$)$_6$O$_2$, MoS$_2$, LaAlO$_3$, (Mn, Zn)Fe$_2$O$_4$, Hf, Zr, ZrN, Sc, ScN, NbN, and TiN; then
depositing a second single-crystal sacrificial layer on the first single-crystal sacrificial layer, wherein the base substrate and the first and second single-crystal sacrificial layers form a triple-layer combined substrate; then
epitaxially fabricating the InGaAlN light-emitting semiconductor structure on the combined substrate;
transferring the InGaAlN structure fabricated on the combined substrate to a support substrate, thereby facilitating a vertical electrode configuration;
covering a light-emitting surface of the InGaAlN structure with a passivation layer; and then
fabricating metal layers which are situated between the InGaAlN structure and the support substrate, wherein the metal layers comprise a p-side ohmic-contact layer, a light reflective layer, and a diffusion barrier layer; and
wherein the p-side ohmic-contact layer comprises a periodical matrix of segregated ohmic-contact pads;
wherein transferring the InGaAlN structure comprises etching the first single-crystal sacrificial layer with a chemical etchant;
wherein the InGaAlN and the base substrate are resistant to the chemical etchant; and
wherein the base substrate can be reused after the InGaAlN structure is transferred.

\* \* \* \* \*